(12) United States Patent
Morikoshi

(10) Patent No.: US 7,755,438 B2
(45) Date of Patent: Jul. 13, 2010

(54) PHASE LOCK LOOP SEMICONDUCTOR DEVICE

(75) Inventor: Nobuyuki Morikoshi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 69 days.

(21) Appl. No.: 12/133,913

(22) Filed: Jun. 5, 2008

(65) Prior Publication Data

US 2008/0303599 A1     Dec. 11, 2008

(30) Foreign Application Priority Data

Jun. 6, 2007     (JP)     ............................. 2007-150393

(51) Int. Cl.
*H03K 5/125*     (2006.01)
*H03L 7/06*     (2006.01)
*H03M 9/00*     (2006.01)

(52) U.S. Cl. ............................ 331/17; 327/50; 341/100; 341/101

(58) Field of Classification Search ................. 331/1 A, 331/8, 17, 18, 25; 327/50; 341/100, 101
See application file for complete search history.

(56) References Cited

U.S. PATENT DOCUMENTS 5,821,818 A * 10/1998 Idei et al. ...................... 331/17
7,551,037 B2 * 6/2009 Isobe et al. .................... 331/16

FOREIGN PATENT DOCUMENTS

JP     63-210784 A     9/1988

* cited by examiner

*Primary Examiner*—David Mis
(74) *Attorney, Agent, or Firm*—Sughrue Mion, PLLC

(57) ABSTRACT

There is provided a PLL circuit 15, a voltage follower 19, and an output terminal 23, and a control voltage V1 of a voltage controlled oscillator circuit in the PLL circuit 15 is outputted to the output terminal 23 via the voltage follower 19.

8 Claims, 16 Drawing Sheets

SW TURNED ON AT HIGH LEVEL

| R_Control[4:0] | MULTIPLICATION RATIO |
|---|---|
| xxxx1 | 1.5 |
| xxx10 | 2.0 |
| xx100 | 2.5 |
| x1000 | 3.0 |
| 10000 | 3.5 |
| 00000 | 4.0 |

PHASE LOCK LOOP SEMICONDUCTOR DEVICE

REFERENCE TO RELATED APPLICATION

This application is based upon and claims the benefit of the priority of Japanese patent application No. 2007-150393, filed on Jun. 6, 2007, the disclosure of which is incorporated herein in its entirety by reference thereto.

TECHNICAL FIELD

The present invention relates to a semiconductor device, and particularly to a semiconductor device having a PLL (Phase-Locked Loop) circuit built therein.

BACKGROUND

In recent years, many semiconductor devices comprise a plurality of PLL circuits. In such a semiconductor device, when high-speed operation is demanded, the quality of the chip greatly depends on the characteristics of the built-in PLL circuits. V-F characteristics (VCO (Voltage controlled oscillator) control voltage-oscillation frequency characteristics), one of the most important characteristics, of a PLL circuit can be verified by measuring the VCO control voltage. Such a technology for measuring PLL circuits is disclosed in Patent Document 1.

FIG. 16 is a block diagram showing the configuration of a device that measures the transfer characteristics of a phase-locked loop oscillator, described in Patent Document 1. In FIG. 16, a low frequency oscillator (OSC) 101 outputs the frequency having the transfer characteristics that it tries to measure and outputs this output signal to a voltage controlled oscillator (VCO) 102. An output of the voltage controlled oscillator 102 is fed to a phase-locked loop oscillator 103. The phase-locked loop oscillator 103 includes a phase comparator circuit (COMP) 104, a loop filter circuit (FIL) 105, and a voltage controlled oscillator (VCO) 106 that constitute a phase-locked loop, and an output of the voltage controlled oscillator 106 is extracted as an output of the phase-locked loop oscillator.

The transfer characteristics of this phase-locked loop oscillator 103 are measured by feeding the output of the low frequency oscillator 101, i.e., the control signal of the voltage controlled oscillator 102, and an output of the loop filter circuit 105 in the phase-locked loop oscillator 103, i.e., the control signal of the voltage controlled oscillator 106, to a measuring device 107. The measuring device 107 measures the transfer characteristics of the phase-locked loop oscillator 103 by measuring the amplitude and phase ratios of the control signals of the voltage controlled oscillators 102 and 106.

[Patent Document 1]
Japanese Patent Kokai Publication No. JP-A-63-210784

SUMMARY OF THE DISCLOSURE

The entire disclosure of Patent Document 1 is incorporated herein by reference thereto. The following analysis is given by the present invention.

However, in FIG. 16, when the control voltage of the voltage controlled oscillator 106 is being measured, if the wiring of an alternating current signal such as a clock signal or data signal exists near the wiring from the loop filter circuit 105 to the measuring device 107 or near the connection node of the measuring device 107, the control signal will include noise from the alternating current signal. As a result, the oscillation frequency of the voltage controlled oscillator 106 will fluctuate and so will the output signal of the phase-locked loop oscillator 103, causing jitter and resulting in deterioration of measurement accuracy.

A semiconductor device relating to an aspect of the present invention comprises a PLL circuit, a buffer amplifier, and an output terminal. A control voltage of a voltage controlled oscillator circuit in the PLL circuit is outputted to the output terminal via the buffer amplifier.

The meritorious effects of the present invention are summarized as follows.

According to the present invention, since the control voltage of the voltage controlled oscillator circuit VCO is outputted to the output terminal via the buffer amplifier, noise relating to a measurement operation is reduced and the accuracy of measuring the control voltage is improved.

PREFERRED MODES OF THE INVENTION

Figure 1:
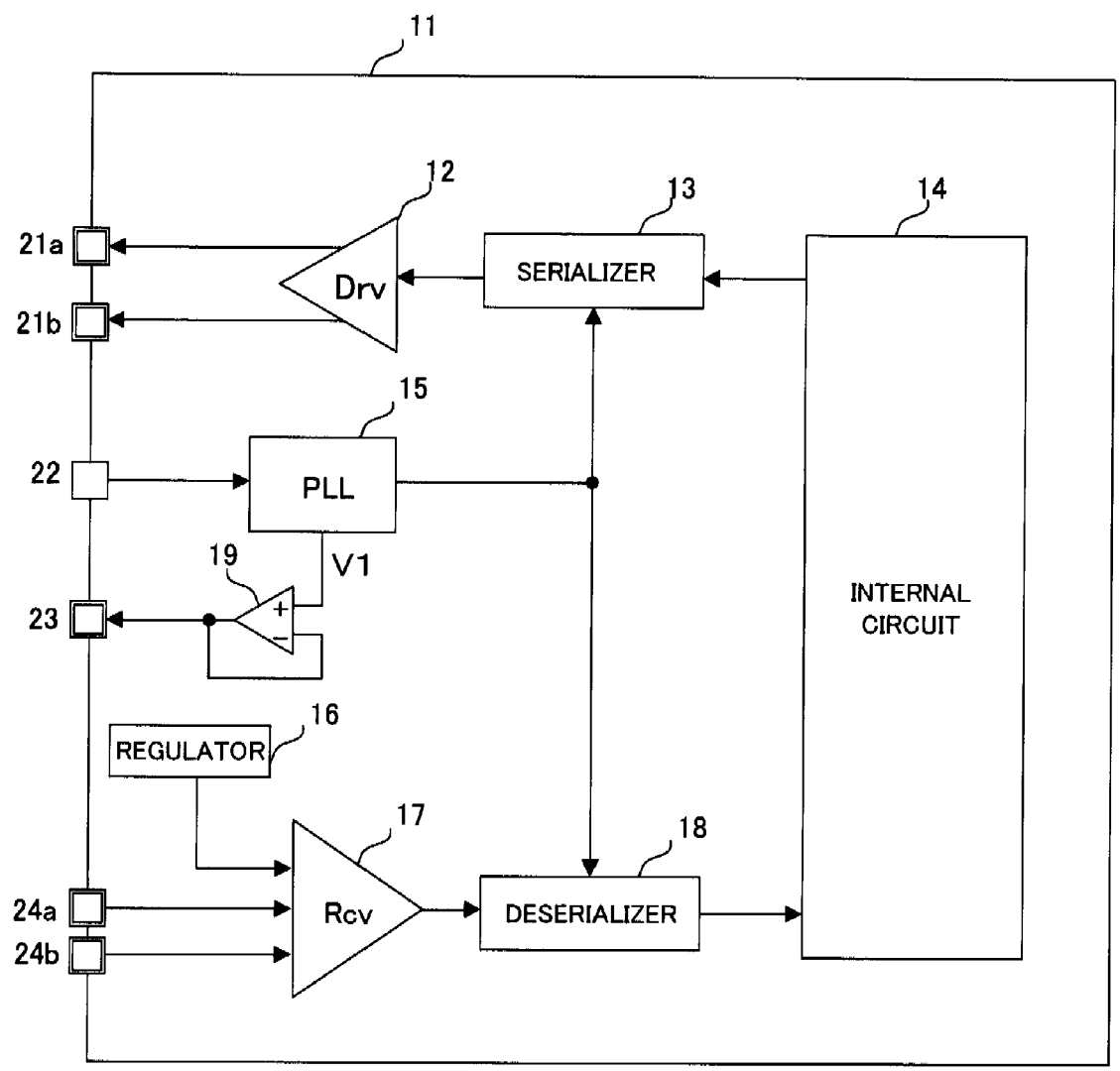
FIG. 1 is a block diagram showing the configuration of a semiconductor device relating to a first example of the present invention.

A semiconductor device relating to an example of the present invention comprises a PLL circuit, a buffer amplifier, and an output terminal. The PLL circuit outputs a control voltage of a voltage controlled oscillator circuit built therein to the output terminal via the buffer amplifier.

Further, the semiconductor device may comprise an input terminal, and further comprise a comparator between the buffer amplifier and the output terminal. The comparator may have one of its input ends connected to the buffer amplifier, the other input ends connected to the input terminal, and its output end connected to the output terminal.

Further, the semiconductor device may further comprise a voltage generating circuit that generates a voltage, which becomes a judging reference for the signal level of a serial data signal, and a switch circuit that performs switching operations so that an output of the buffer amplifier is connected to one of the input ends of the comparator in test mode and an output of the voltage generating circuit is connected to the other input end of the comparator in normal mode. The input terminal may be a terminal that receives the serial data signal.

Further, the semiconductor device may further comprise: a voltage generating circuit that generates a voltage, which serves as a judging reference for the signal level of a serial data signal; and a switch circuit that performs switching operations so that the output of the buffer amplifier is connected to one of the input ends of the comparator in the test mode, and in the normal mode the output of the voltage generating circuit is connected, via the buffer amplifier, to the one of the input ends of the comparator instead of connecting the input of the buffer amplifier to the output of the voltage controlled oscillator circuit. The input terminal may receive the serial data signal.

Further, in the semiconductor device, the buffer amplifier may be externally gain-adjustable.

Further, in the semiconductor device, the gain of the buffer amplifier may be fixed in normal mode and adjustable in test mode.

Further, in the semiconductor device, the gain of the buffer amplifier may be larger in test mode than in normal mode.

Further, in the semiconductor device, an input end of the buffer amplifier may be connected to a control input terminal of the voltage controlled oscillator circuit.

Further, in the semiconductor device, the PLL circuit may comprise a filter circuit, having a second capacitance element connected in parallel to a series circuit of a first capacitance element and a resistance element, between the control input terminal of the voltage controlled oscillator circuit and the ground, and the input end of the buffer amplifier may be connected to one end of the first capacitance element having the other end grounded, instead of the control input terminal of the voltage controlled oscillator circuit.

In the semiconductor device as described above, the control voltage of the voltage controlled oscillator circuit in the PLL circuit is outputted to the output terminal via the buffer amplifier. Therefore, the control voltage can be measured without being influenced by noise related to the measurement. In this case, the measurement can be performed without influencing the characteristics of the PLL circuit because of the existence of the buffer amplifier. Examples of the present invention will be further described with reference to the drawings.

EXAMPLE 1

FIG. 1 is a block diagram showing the configuration of a semiconductor device relating to a first example of the present invention. In FIG. 1, the semiconductor device 11 is a device that transfers serial data and comprises a driver 12, a serializer 13, an internal circuit 14, a PLL circuit 15, a regulator 16, a receiver 17, a deserializer 18, a voltage follower 19, data output terminals 21a and 21b, a clock input terminal 22, an output terminal 23, and data input terminals 24a and 24b.

The PLL circuit 15 receives a clock signal fed to the clock input terminal 22, multiplies it, and outputs the result as a reference clock signal for converting serial data to the serializer 13 and the deserializer 18. The voltage follower 19 buffers a VCO control voltage signal V1 inside the PLL circuit 15 and outputs it from the output terminal 23.

Transmitted data outputted from the internal circuit 14 are converted by the serializer 13 into transmitted serial data. The transmitted serial data converted are made into transmitted differential serial data signals by the driver 12 and outputted from the data output terminals 21a and 21b to the outside.

Received differential serial data signals supplied to the data input terminals 24a and 24b from the outside are converted into received serial data by the receiver 17 using an output voltage of the regulator 16 as the reference voltage and are outputted to the deserializer 18. The deserializer 18 converts the received serial data into received data and outputs the result to the internal circuit 14.

Next, an example of a method for measuring the V-F characteristics of the PLL circuit 15 will be described. Here, the multiplying ratio of the PLL circuit 15 is N; the minimum oscillation frequency of the VCO of the PLL circuit 15 is Fmin; and the maximum oscillation frequency is Fmax.

(1) A clock signal having a frequency not greater than Fmin/N is fed to the clock input terminal 22, and the voltage (V) of the VCO control signal at the output terminal 23 is measured. The oscillation frequency of the VCO is measured at the same time.

(2) The frequency of the clock signal is gradually increased, and the measurements of the voltage (V) and the oscillation frequency of the VCO control signal is repeated until the frequency of the clock signal is equal to or greater than Fmax/N.

Figure 2:
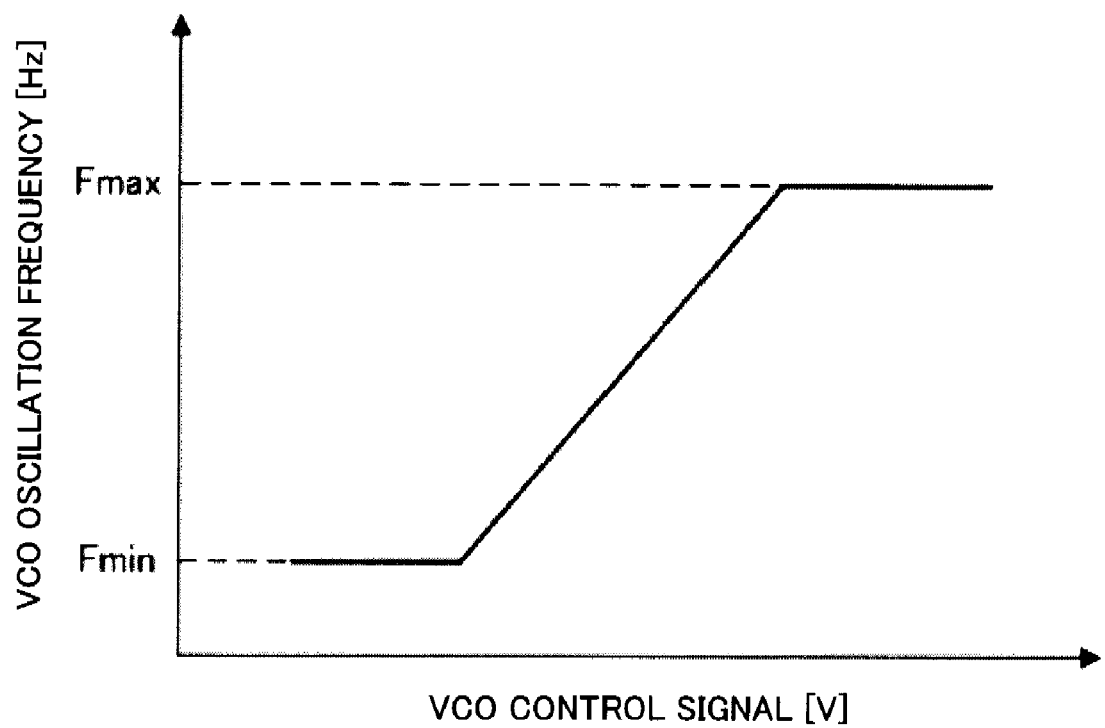
FIG. 2 is a drawing showing V-F characteristics.

The V-F characteristics shown in FIG. 2 can be obtained from the measurements described above.

In the semiconductor device 11 configured as above, the VCO control signal V1 is temporarily buffered by the voltage follower 19 and then outputted from the output terminal 23. As a result, even when noise is applied to the output terminal 23, the VCO control signal V1 does not fluctuate and the characteristics of the PLL circuit 15 are not influenced.

EXAMPLE 2

Figure 3:
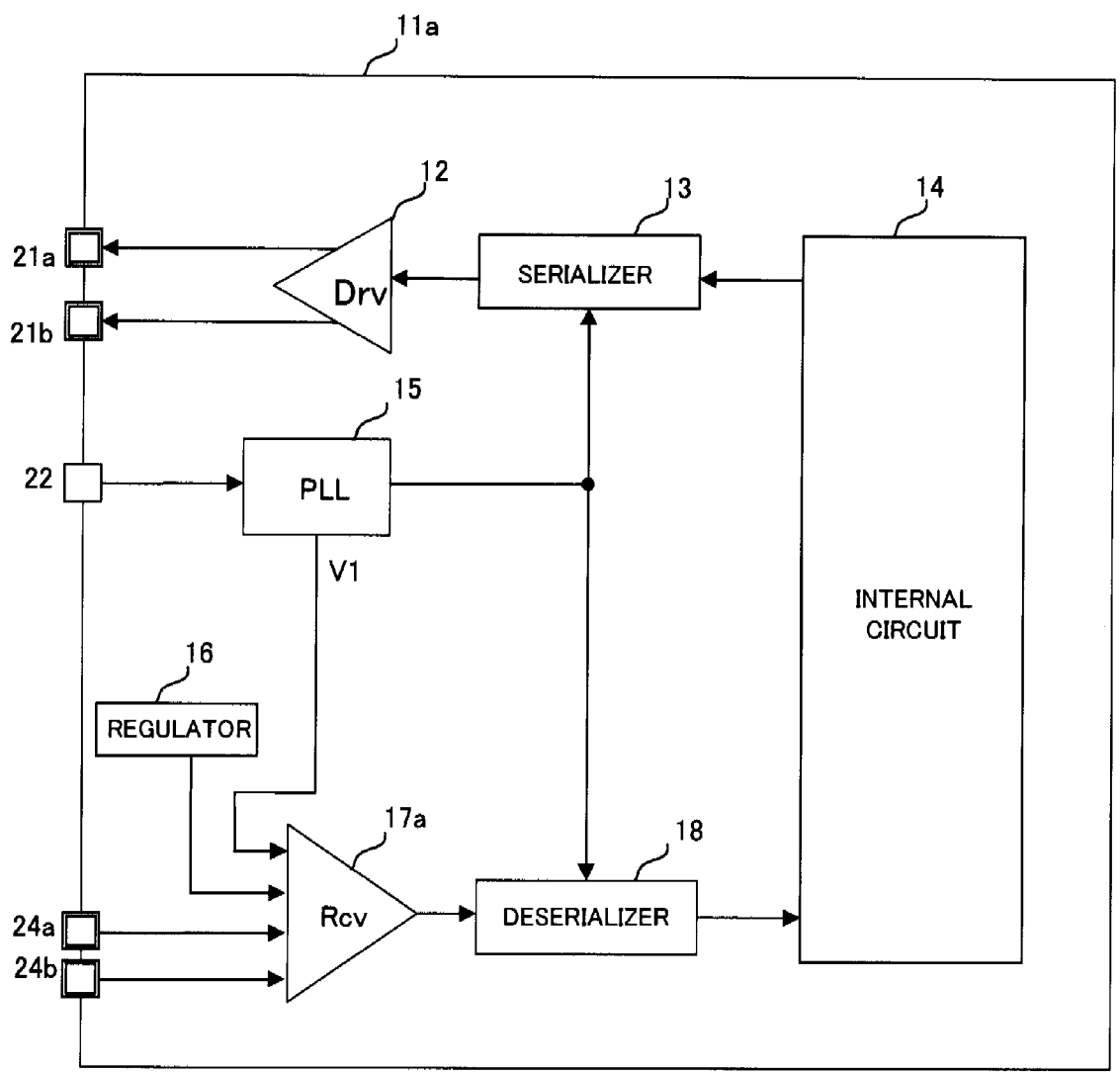
FIG. 3 is a block diagram showing the configuration of a semiconductor device relating to a second example of the present invention.

FIG. 3 is a block diagram showing the configuration of a semiconductor device relating to a second example of the present invention. In FIG. 3, the symbols same as the ones in FIG. 1 indicate the same things, thus the explanations of them will be omitted. Example 2 is different from Example 1 in that the voltage follower 19 and the output terminal 23 in FIG. 1 are omitted and the VCO control signal V1 (simply called "control signal V1" hereinafter) of the PLL circuit 15 is outputted to a receiver 17a. A main section of the semiconductor device such as the PLL circuit 15 and the receiver 17a will be described below.

Figure 4:
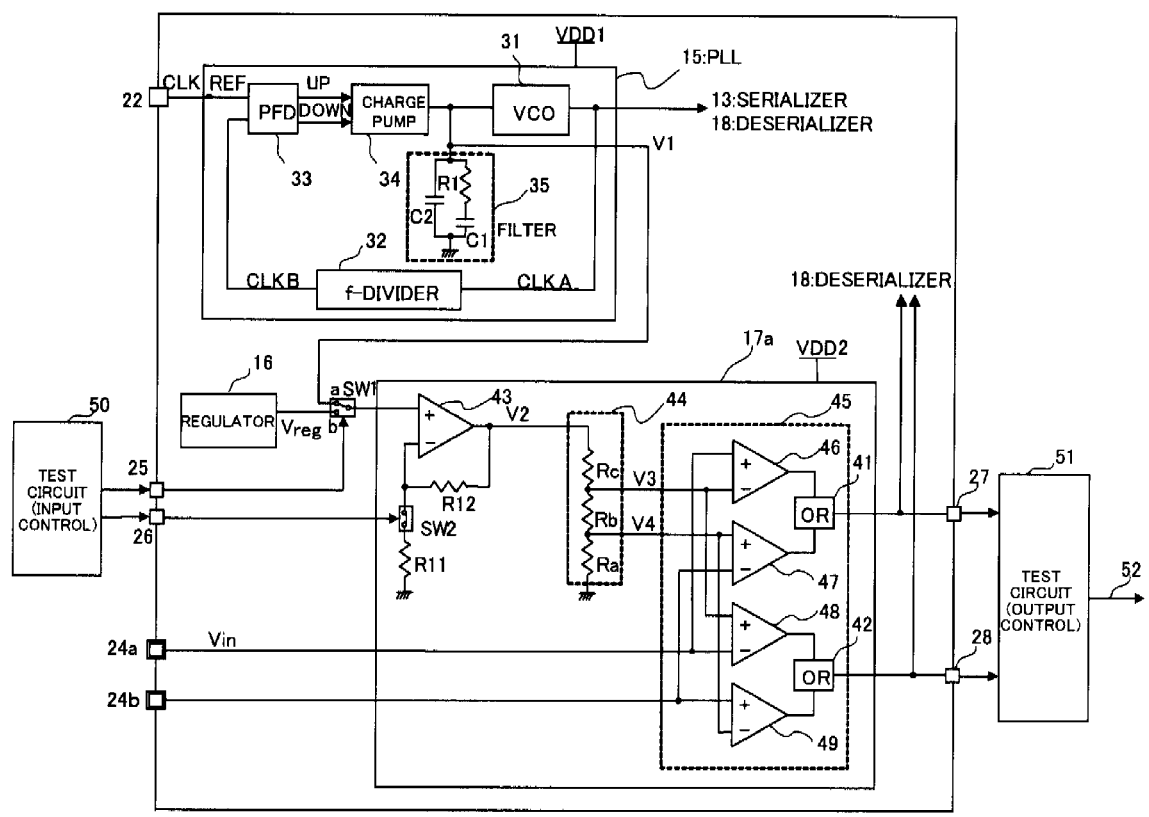
FIG. 4 is a circuit diagram of a main section of the semiconductor device relating to the second example of the present invention.

FIG. 4 is a circuit diagram of the main section of the semiconductor device relating to the second example of the present invention. First, the PLL circuit will be described. The PLL circuit 15 comprises a VCO (voltage controlled oscillator) 31, a frequency divider (f—divider) 32, a PFD (phase/frequency comparator) 33, a charge pump 34, and a filter 35.

The PFD 33 compares the phases and frequencies of a clock signal CLKREF, supplied to the clock input terminal 22, and an output signal CLKB of the frequency divider 32, and depending on the comparison result, the PFD 33 outputs an UP signal or DOWN signal to the charge pump 34. In other words, when the frequency of the output signal CLKB is slower than that of the reference clock signal CLK_REF, or its phase is behind, the PFD 33 outputs the UP signal. On the other hand, the frequency of the output signal CLKB is faster than that of the reference clock signal CLK_REF, or its phase is early, the PFD 33 outputs the DOWN signal.

The charge pump 34 supplies or draws current, depending on whether it receives the UP signal or the DOWN signal respectively, and these currents are charged or discharged by the filter 35, generating a control voltage V1 of VCO 31. The filter 35 has a capacitance element C2 connected in parallel to a series circuit of a capacitance element C1 and a resistance element R1 and one ends of the capacitance elements C1 and C2 grounded.

The VCO 31 oscillates at a frequency corresponding to the control voltage V1 and outputs the oscillation signal CLKA to the serializer 13, the deserializer 18, and the frequency divider 32.

The frequency divider 32 divides the frequency of the oscillation signal CLKA and outputs the frequency-divided output signal CLKB to the PFD 33.

The PLL circuit 15 configured as above has a feedback circuit formed inside. Therefore, the VCO control voltage V1 becomes stable when the frequencies and phases of the clock signal CLK_REF and the output signal CLKB of the frequency divider 32 coincide.

Next, the receiving unit 17a will be described, which includes an amplifier (comparator) 43, a resistance string 44, and a receiver circuit 45 in this order from the upstream.

A switch SW1 switches between the output V1 of the charge pump 34 (the input of the filter 35 or the VCO 31) and the output of the regulator 16, and feeds one of them to the non-inverted input (+) of an amplifier (comparator) 43. Note that the switch signal for the switch SW1 is supplied by a test circuit 50 via an input terminal 25.

The amplifier 43 has its output connected to one end of the resistance string 44 and to one end of a resistance element R12. Further, the inverted input (−) is connected to the other end of the resistance element R12 and to one end of a resistance element R11 via a switch SW2. The other end of the resistance element R11 is grounded.

The switch SW2 is turned on/off by a control signal supplied by the test circuit 50 via the input terminal 26, and it connects and opens the connection between the inverted input of the amplifier 43 and GND via the resistance element R11. When the switch SW2 is turned off, since the output and the inverted input of the amplifier 43 are connected via the resistance element R12, the amplifier 43 operates as a voltage follower. Further, when the switch SW2 is turned on, the amplifier 43 becomes a non-inverting amplifier and its amplification ratio N is expressed by N=(R11+R12)/R11.

In the resistance string 44, resistance elements Ra, Rb, Rc are connected in series in this order from the ground side, and one end of the resistance element Rc is connected to the output of the amplifier 43.

As for the receiver circuit 45, a comparator 46 has its inverted input (−) connected to the connection node between the resistance elements Rb and Rc, its non-inverted input (+) connected to the input terminal 24a, and its output connected to an input end of an OR circuit 41.

A comparator 47 has its inverted input (−) connected to the input terminal 24b, its non-inverted input (+) connected to the connection node between the resistance elements Ra and Rb, and its output connected to the other input end of the OR circuit 41.

A comparator 48 has its inverted input (−) connected to the input terminal 24a, its non-inverted input (+) connected to the connection node between the resistance elements Rb and Rc, and its output connected to an input end of an OR circuit 42.

A comparator 49 has its inverted input (−) connected to the connection node between the resistance elements Ra and Rb, its non-inverted input (+) connected to the input terminal 24b, and its output connected to the other input end of the OR circuit 42.

The OR circuit 41 outputs an output signal to a test circuit 51 via a terminal 27 and to the deserializer 18, thus making up the receiver circuit 45.

The OR circuit 42 outputs an output signal to the test circuit 51 via a terminal 28 and to the deserializer 18.

The serial data (differential data) fed to the input terminals 24a and 24b are compared with threshold voltages V3 (the voltage of the connection node between the resistance elements Rb and Rc) and V4 (the voltage of the connection node between the resistance elements Ra and Rb) by the four comparators 46, 47, 48, and 49 in the receiver circuit 45. The output terminals 27 and 28 are the output terminals of the receiver circuit 45, and the output terminal 27 outputs an OR operation result of the comparison results by the comparators 46 and 47. Further, the output terminal 28 outputs an OR operation result of the comparison results by comparators 48 and 49. The outputs of the OR circuits 41 and 42 are both connected to the deserializer 18 and the test circuit (output control) 51 used for LSI testing. The test circuit (output control) 51 outputs the signals from the OR circuits 41 and 42 as a test output signal(s) 52 to the outside of the LSI.

The input terminals 25 and 26 receive test control signals from the test circuit (input control) 50 during LSI testing and the signals control the switches SW1 and SW2 respectively. When the switch SW1 turns to the "a" side, the input signal on the non-inverted (+) side of the amplifier 43 is the VCO control signal V1, and when the switch SW1 turns to the "b" side, it is switched to a regulated voltage Vreg outputted by the regulator 16.

In the configuration described above, during normal operation, the switch SW1 turns to the "b" side and the switch SW2 is turned off. Therefore the amplifier 43 operates as a voltage follower and transfers the regulated voltage Vreg outputted from the regulator 16 to one end of the resistance string 44 without modifying it (e.g., Vreg=V2). The resistance string 44 divides the voltage V2 and generates the threshold voltages V3 and V4 for the comparators in the receiver circuit 45.

Next, the operation during the measurement of the VCO control voltage will be described. During this operation, the input terminal 25 receives a signal that has the switch SW1 turn to (connect) the "a" side, changing the input voltage of the amplifier 43 to the control voltage V1 from the regulated voltage Vreg of the regulator 16.

Further, by turning on/turning off the switch SW2 using the signal from the input terminal 26, the amplifier 43 switches between a function as a voltage follower and a function as a non-inverting amplifier having an amplification ratio of N, respectively. In other words:

when the switch SW2 is turned off, $$V2=V1$$

when the switch SW2 is turned on, $$V2=N \times V1$$

At this time, the threshold voltages V3 and V4 of the receiver circuit 45 are as follows:

As for V3:
When the SW2 is turned off, $$V3=(Ra+Rb)\times V1/(Ra+Rb+Rc) \quad \text{Equation (1)}$$

As for V4:
When the SW2 is turned on, $$V3=(Ra+Rb)\times N\times V1/(Ra+Rb+Rc) \quad \text{Equation (2)}$$

When the SW2 is turned off, $$V4=Ra\times V1/(Ra+Rb+Rc)$$

When the SW2 is turned on, $$V4=Ra\times N\times V1/(Ra+Rb+Rc)$$

The measurement of the VCO control voltage is performed using one of the four comparators in the receiver circuit 45. Here, an example using the comparator 46 will be described.

Figure 5:
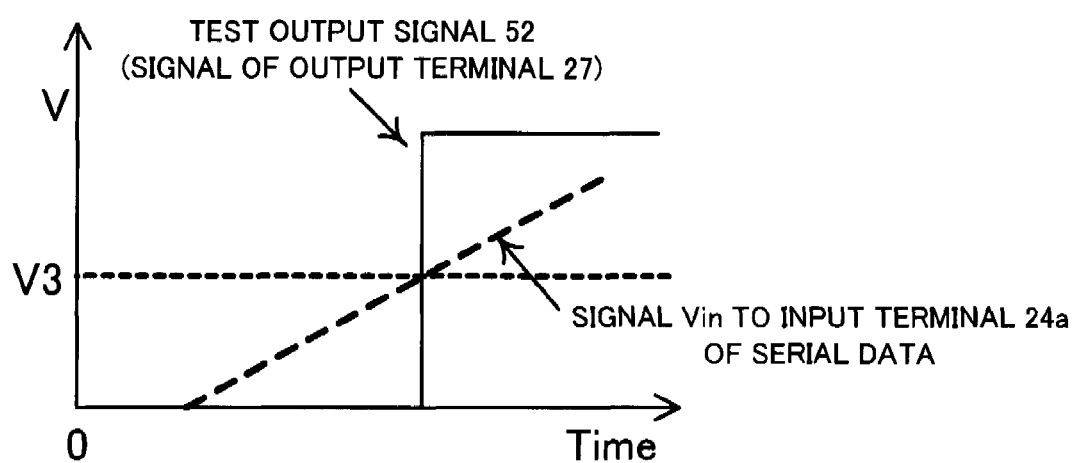
FIG. 5 is a drawing showing how an input signal Vin applied to an input terminal changes.

In FIG. 5, the graph shows how a signal Vin applied to the input terminal 24a changes.

(1) The signal Vin that increases over time as shown in FIG. 5 is applied to the input terminal 24a.

(2) The comparator 46 compares Vin and V3, and when Vin≧V3, it outputs a high level signal whereupon the output signal from the output terminal 27 rises (so does the test output signal 52). By detecting the voltage at this time, the threshold voltage V3 of the comparator 46 can be measured.

(3) From the equations (1) and (2), the control voltage V1 can be derived from V3 as follows:

When SW2 is turned off, $$V1=(Ra+Rb+Rc)\times V3/(Ra+Rb) \quad \text{Equation (3)}$$

When SW2 is turned on, $$V1=(Ra+Rb+Rc)\times V3/N/(Ra+Rb) \quad \text{Equation (4)}$$

Next, the on/off operation of the switch SW2 during testing and how the amplification ratio of the non-inverting amplifier with an amplification ratio of N is set will be described. Here, as shown in FIG. 4, let us assume that the power supply voltage of the PLL circuit be VDD1 and the power supply voltage of the receiving unit 17a including the amplifier 43, the resistance string 44, and the receiver circuit 45 be VDD2 (≧VDD1). Since V1 changes within a range of 0 to VDD1, taking the relationship between VDD1 and VDD2 into consideration, for instance, the ratio should be set as described below so that the threshold voltage V3 is changed to a voltage level with which the comparators 46, 47, 48, and 49 operate sufficiently.

(1) When VDD1=VDD2, the switch SW2 is turned off and the amplifier 43 is used as a voltage follower.

Figure 6:
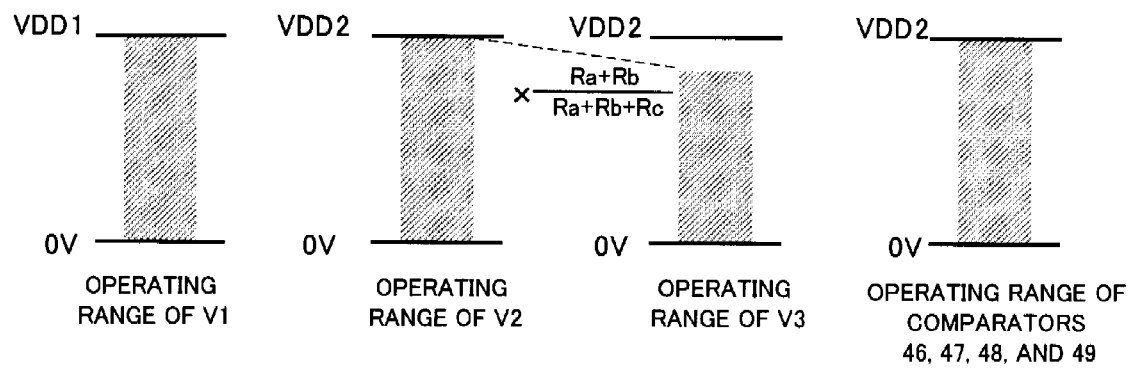
FIG. 6 is a first drawing showing the operating ranges of V1, V2, and V3, and the comparators.

FIG. 6 shows the relationship between the operating ranges of V1, V2, and V3, and the comparators 46-49. Since the operating ranges of V1 and the comparators 46-49 are identical, V3, obtained by having the resistance string 44 divide V2, can sufficiently operate the comparators.

(2) When VDD1<VDD2, the SW2 is turned on and the relationship between R11 and R12 is set as follows:

$$VDD2/VDD1\geq (R11+R12)/R11=N \quad \text{Equation (5)}$$

In this case, the amplifier 43 is used as a non-inverting amplifier having an amplification ratio of N.

Figure 7:
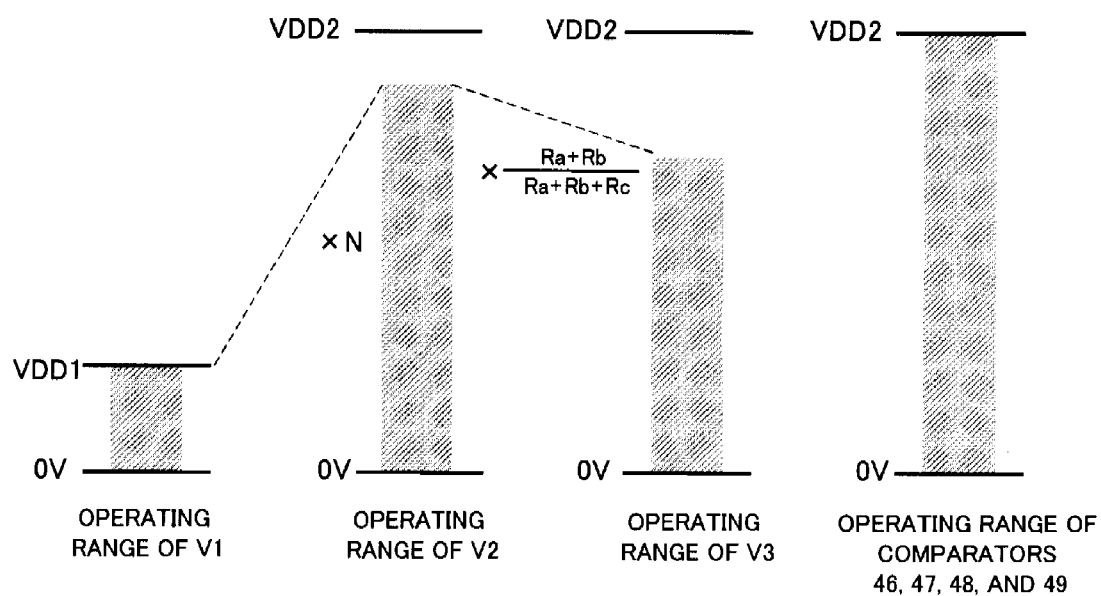
FIG. 7 is a second drawing showing the operating ranges of V1, V2, and V3, and the comparators.

FIG. 7 shows the relationship between the operating ranges of V1, V2, and V3, and the comparators 46-49 in this case. The operating range of V1 is narrower than that of the comparators 46-49, therefore V1 is multiplied by the amplifier 43 by the ratio of N, bringing V1 into a range where it can sufficiently operate the comparators 46-49.

In the above explanation, the relationship between V1 and V3 is determined only by the ratio between the resistance values, as indicated by the equations (3) to (5). Therefore high measurement accuracy can be obtained without being influenced by the absolute dispersion of the resistance values.

In Example 1, since the VCO control signal is outputted to the outside of the LSI, a terminal exclusively dedicated for an analog signal such as the output terminal 23 in FIG. 1 is necessary. On the other hand, in Example 2, since the VCO control signal is converted into a digital signal by and after the comparison by the comparators, the output terminal can be shared with the LSI test circuit, reducing the need for the analog output terminal.

EXAMPLE 3

Figure 8:
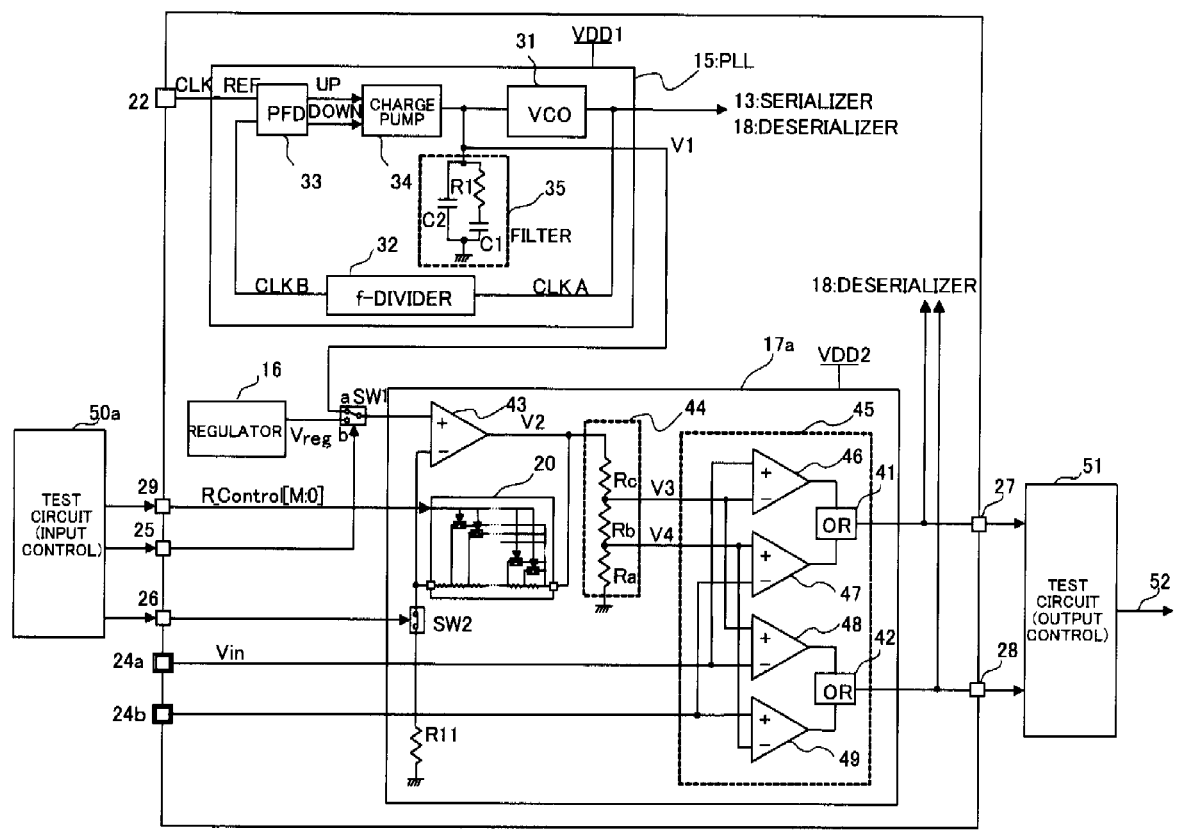
FIG. 8 is a block diagram showing the configuration of a semiconductor device relating to a third example of the present invention.

FIG. 8 is a block diagram showing the configuration of a semiconductor device relating to a third example of the present invention. In FIG. 8, the symbols same as the ones in FIG. 4 indicate the same things, thus the explanations of them will be omitted. In the semiconductor device shown in FIG. 8, the resistance R12 is changed to a resistance varying circuit 20. Further, a test circuit 50a outputs a resistance varying signal for controlling the resistance varying circuit 20 and an input terminal 29 is added for receiving this resistance varying signal.

Figure 9:
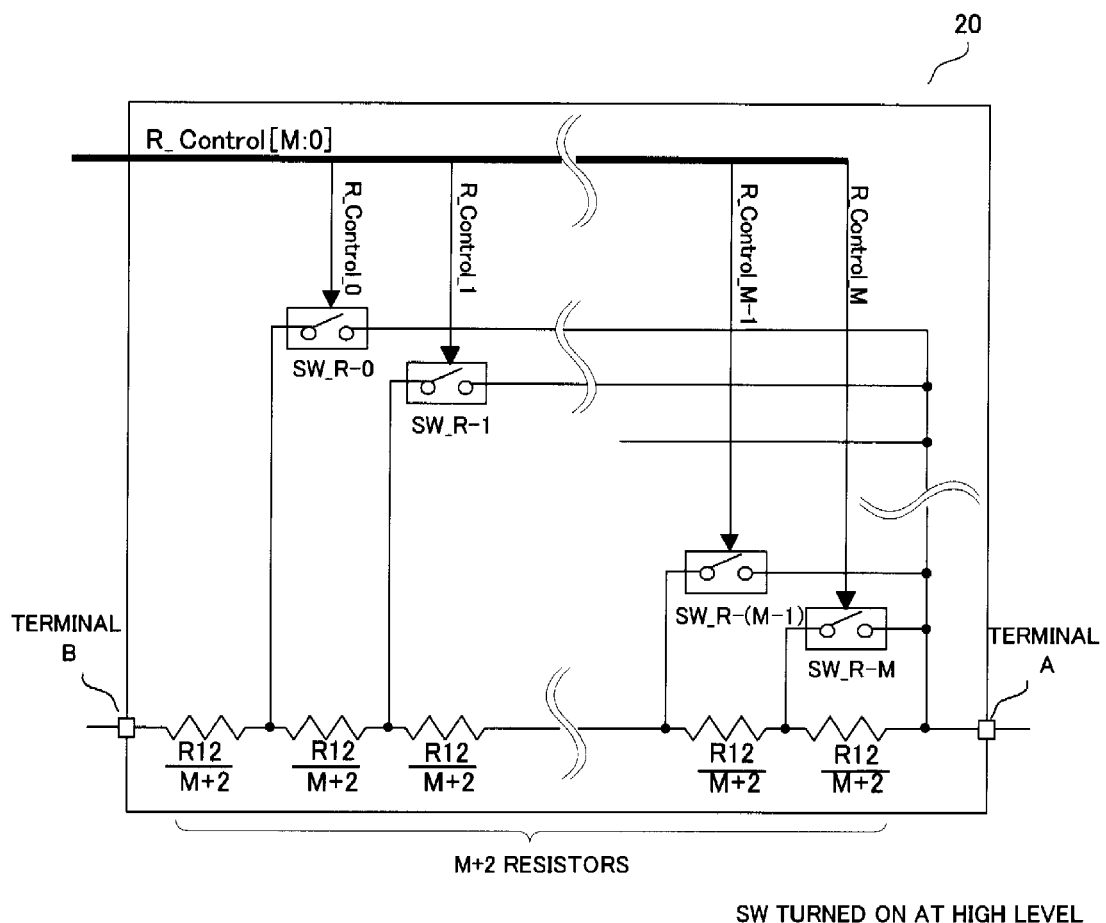
FIG. 9 is a circuit diagram showing an example of a resistance varying circuit.

FIG. 9 is a circuit diagram showing an example of the resistance varying circuit 20. The resistance varying circuit 20 is controlled by a resistance control signal R_Control [M:0] of M+1 bit fed to the input terminal 29. Terminals A and B of the resistance verifying circuit are respectively connected to the output and the inverted input (−) terminal of the amplifier 43. The resistance value between the terminals A and B is the resistance R12 and is divided by M+2 inside the circuit. Further, the circuit has M+1 switches SW_R-0 to SW_R-M therein, and each switch is on-off controlled by the resistance control signal R_Control [M:0]. An nth-bit signal R_Control_n (here 0≦n≦M) controls the switch SW_R-n, and when it is turned on, a node between an n+1th resistance and an n+2th resistance from the terminal B side is short-circuited to the terminal A.

By turning the switch SW2 on and changing the resistance control signal R_control [M:0], the amplification ratio of the amplifier 43 can be changed and the relationship between V1 and V2 can be changed as follows:

When only SW_R-0 is turned on:

$$V2=(R11+R12/(M+2))\times V1/R11$$

When only SW_R-1 is turned on:

$$V2 = (R11 + R12\times 2/(M+2))\times V1/R11$$

$$\vdots$$

When only SW_R-M is turned on:

$$V2=(R11+R12\times (M+1)/(M+2))\times V1/R11$$

When all the switches are turned off:

$$V2=(R11+R12)\times V1/R11$$

Further, by turning the switch SW2 in FIG. 8 off, the amplifier 43 operates as a voltage follower and V2=V1.

Figure 10:
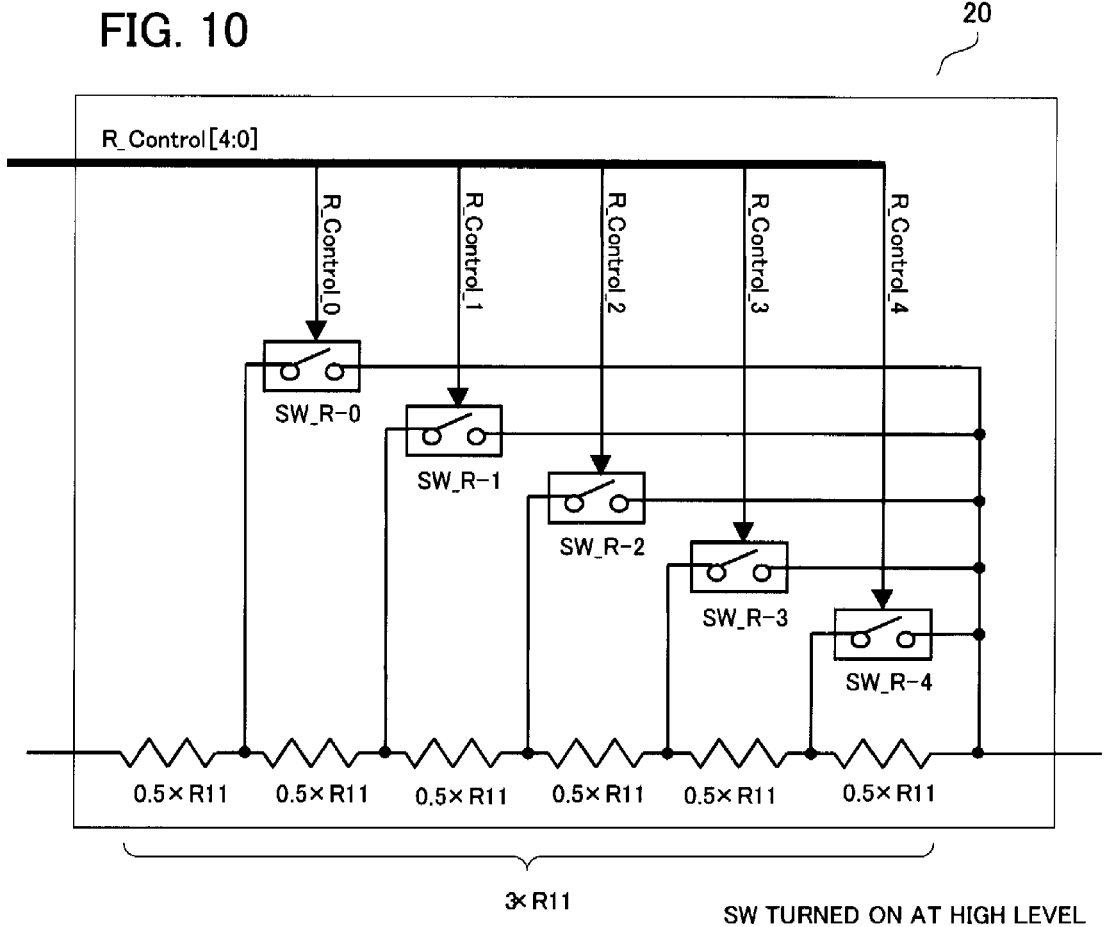
FIG. 10 is a circuit diagram showing a more concrete example of the resistance varying circuit.

FIG. 10 shows a concrete example in which the resistance control signal R_Control [M:0] is a 5-bit signal R_Control

[4:0] and the resistance value of the resistance element R12 is set to three times as much as the resistance value of the resistance element R11 (3×R11). In this case, the value of each resistance element in the resistance varying circuit is 0.5×R11 and the multiplication ratio can be switched among six stages, from 1.5 to 4.

Figure 11A:
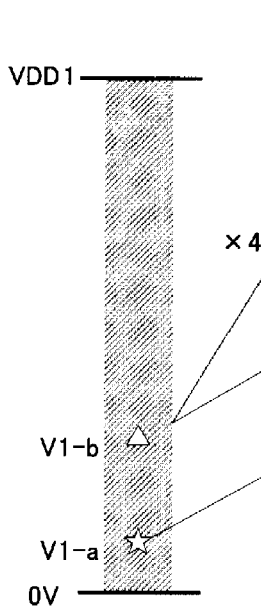
FIGS. 11A-11D show the relationship of voltages to each other in the third example of the present invention.
Figure 11B:
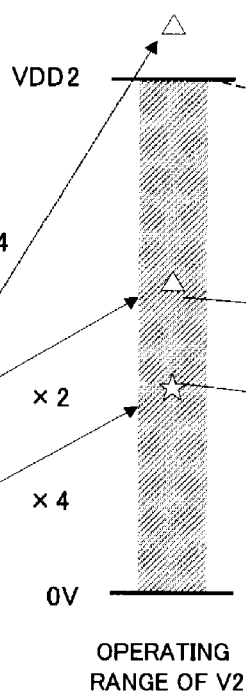
Figure 11C:
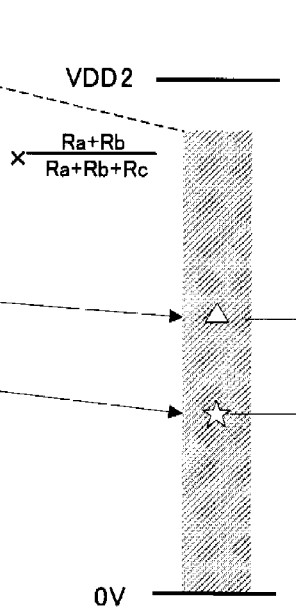
Figure 11D:
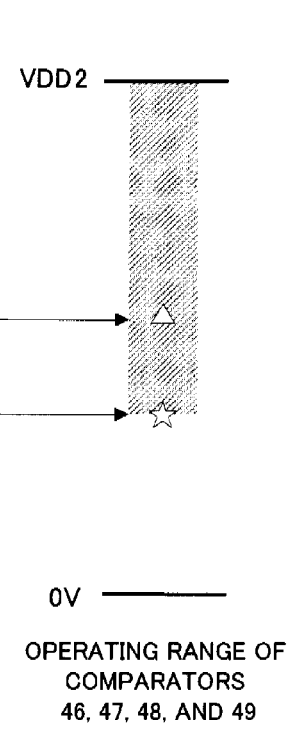

Switching the amplification ratio of the amplifier 43 proves to be effective when the operating range of the comparators 46, 47, 48, and 49 is narrow. Such an example is shown in FIGS. 11A-11D. In this example, as shown in FIG. 11D, the comparators 46, 47, 48, and 49 cannot operate at around 0V, and VDD1=VDD2. When the VCO control voltage is at V1-$a$ in FIG. 11A, by setting the multiplication ratio to four, the device can be used within the operating range of the comparators 46, 47, 48, and 49. When the VCO control voltage is at V1-$b$ in FIG. 11A, if the multiplication ratio is set to four, the voltage of V2 will exceed VDD2, the power supply voltage. Therefore, the multiplication ratio should be set preferably to two so that the device can be used within the operating range of the comparators 46, 47, 48, and 49.

Next, a test method in Example 3 will be described. The measurement method shown in FIG. 5 and described in Example 2 can be used in Example 3, however, a method shown in FIG. 12, which further controls the resistance varying circuit 20, can be used as well. Unlike the example in FIG. 5, the voltage Vin supplied to the input terminal 24$a$ is a constant voltage. Instead, the amplification ratio of the amplifier is stepwise by changed using the resistance control signal R_Control [M:0], and the threshold voltage of the receiver circuit 45 can be derived from the amplification ratio before and after the signal of the output terminal 27 (the output signal 52 of the test circuit) is asserted.

Figure 12:
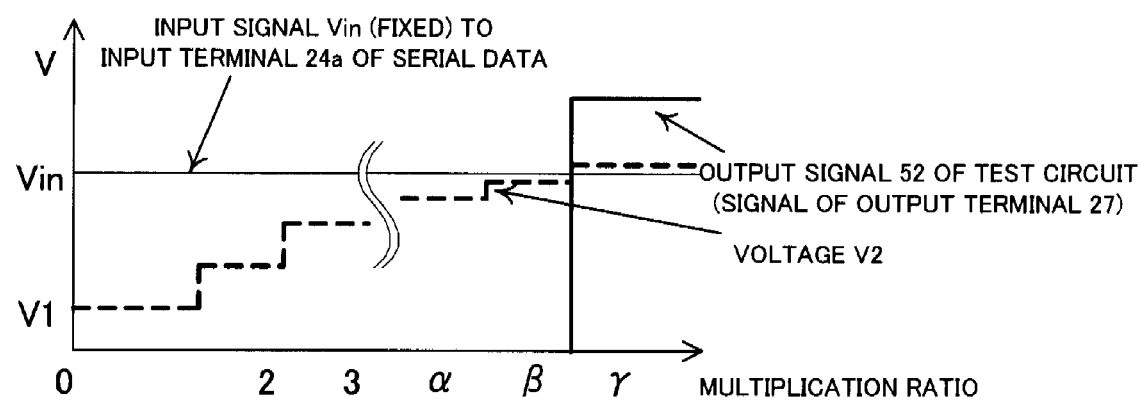
FIG. 12 is a drawing showing a test method in the third example of the present invention.

In the example in FIG. 12, since the output of the comparator 46 is inverted between the multiplication ratios β and γ, the following formula holds:

$(Ra+Rb) \times \beta \times V1/(Ra+Rb+Rc) \leq Vin \leq (Ra+Rb) \times \gamma \times V1/(Ra+Rb+Rc)$ Therefore, V1 is in a range of:

$(Ra+Rb+Rc) \times Vin/\gamma/(Ra+Rb) \leq V1 \leq (Ra+Rb+Rc) \times Vin/\beta/(Ra+Rb)$ By using the configuration as described above, since a test can be performed without being restricted to the operating range of the comparators and the measurement can be performed using only DC signals, the automatic measurement of testers can be easily performed.

EXAMPLE 4

Figure 13:
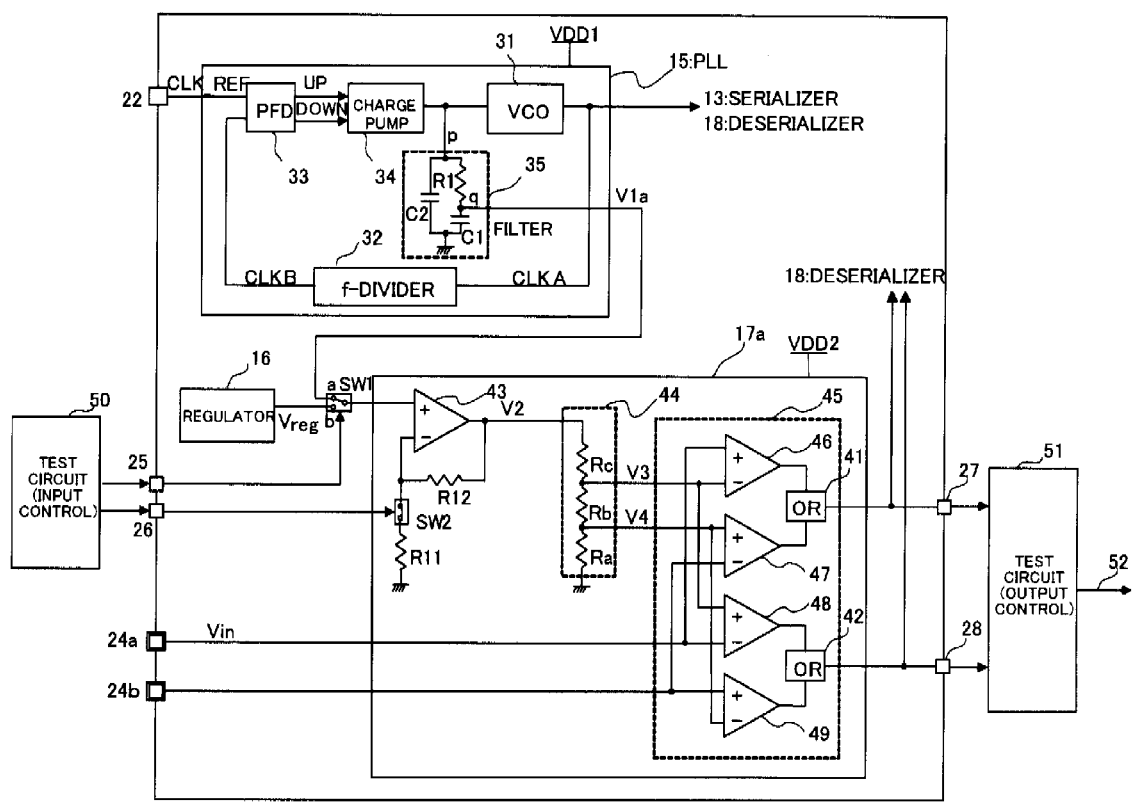
FIG. 13 is a block diagram showing the configuration of a semiconductor device relating to a fourth example of the present invention.

FIG. 13 is a block diagram showing the configuration of a semiconductor device relating to a fourth example of the present invention. In FIG. 13, the symbols same as the ones in FIG. 4 indicate the same things, thus the explanations of them will be omitted. In the semiconductor device shown in FIG. 13, the point where the VCO control voltage is drawn, as shown in FIG. 4, is changed from the contact point (point p) of the charge pump 34, the VCO 31, and the filter 35 to a point q, the serial connection point of the resistance R1 and the condenser C1 constituting the filter 35. The measurement method is the same as the case described in Example 2.

In Example 2 (FIG. 4), when the capacitance of the wiring that draws VCO control voltage and the parasitic capacitance of the switch SW1 are large, the characteristics of the filter is influenced. In the configuration of the filter in the present example, the capacitance of the capacitance element C1 is larger than that of the capacitance element C2. If the VCO control voltage is drawn at the point q as shown in FIG. 13, even when the capacitance of the wiring and the parasitic capacitance of the switch SW1 is not small, as long as it is not too large to be ignored, compared with the capacitance value of the capacitance element C1, the filter characteristics will not be influenced.

EXAMPLE 5

Figure 14:
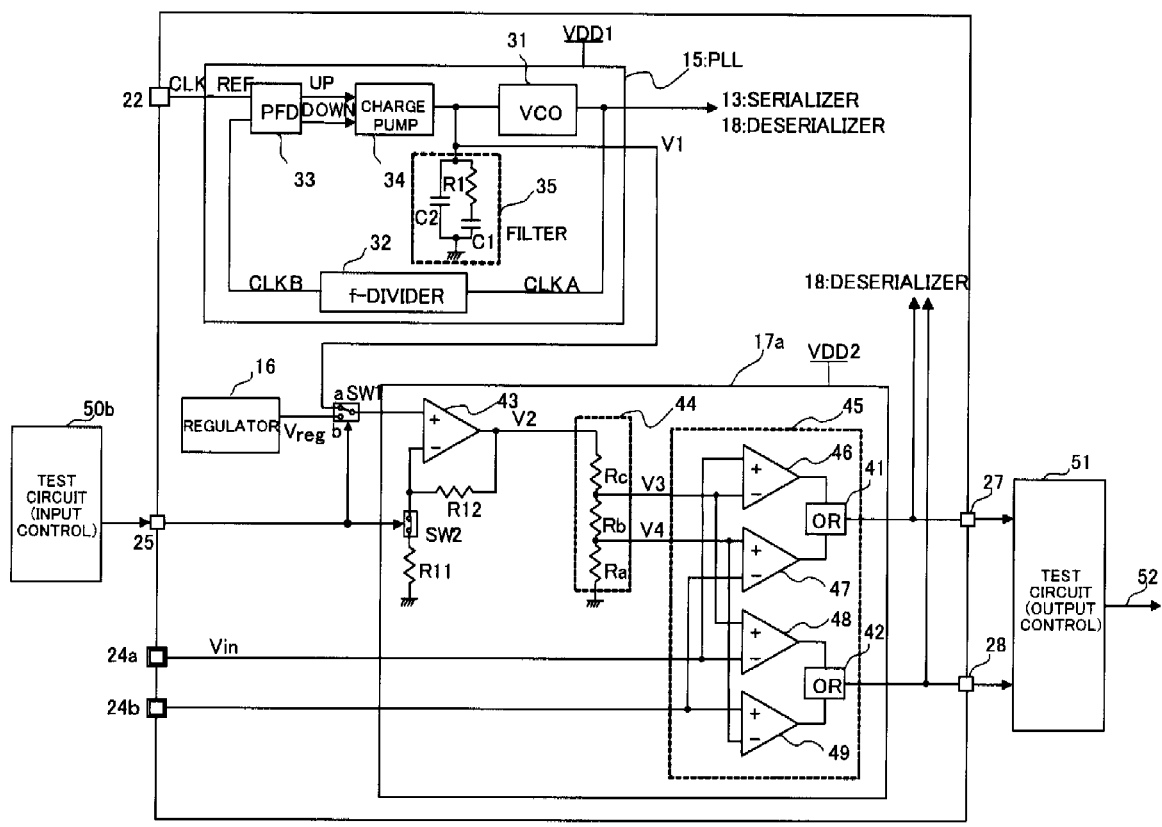
FIG. 14 is a block diagram showing the configuration of a semiconductor device relating to a fifth example of the present invention.

FIG. 14 is a block diagram showing the configuration of a semiconductor device relating to a fifth example of the present invention. In FIG. 14, the symbols same as the ones in FIG. 4 indicate the same things, thus the explanations of them will be omitted. In the semiconductor device shown in FIG. 14, the input terminals 25 and 26 that receive the test control signals for the switches SW1 and SW2 are put together into one terminal 25 so as to operate as follows:

(1) During normal operation
SW1: the "b" side
SW2: off
(2) During the measurement of the VCO control voltage
SW1: the "a" side
SW2: on When the voltage relationship of V1, V2, and V3, and the comparators 46, 47, 48, and 49 is as shown in FIG. 7, since the amplifier 43 is always used as an amplifier having an amplification ratio of N during the measurement of the VCO control voltage, the switches SW1 and SW2 can operate together. In the semiconductor device configured as described above, one input terminal can be omitted.

EXAMPLE 6

Figure 15:
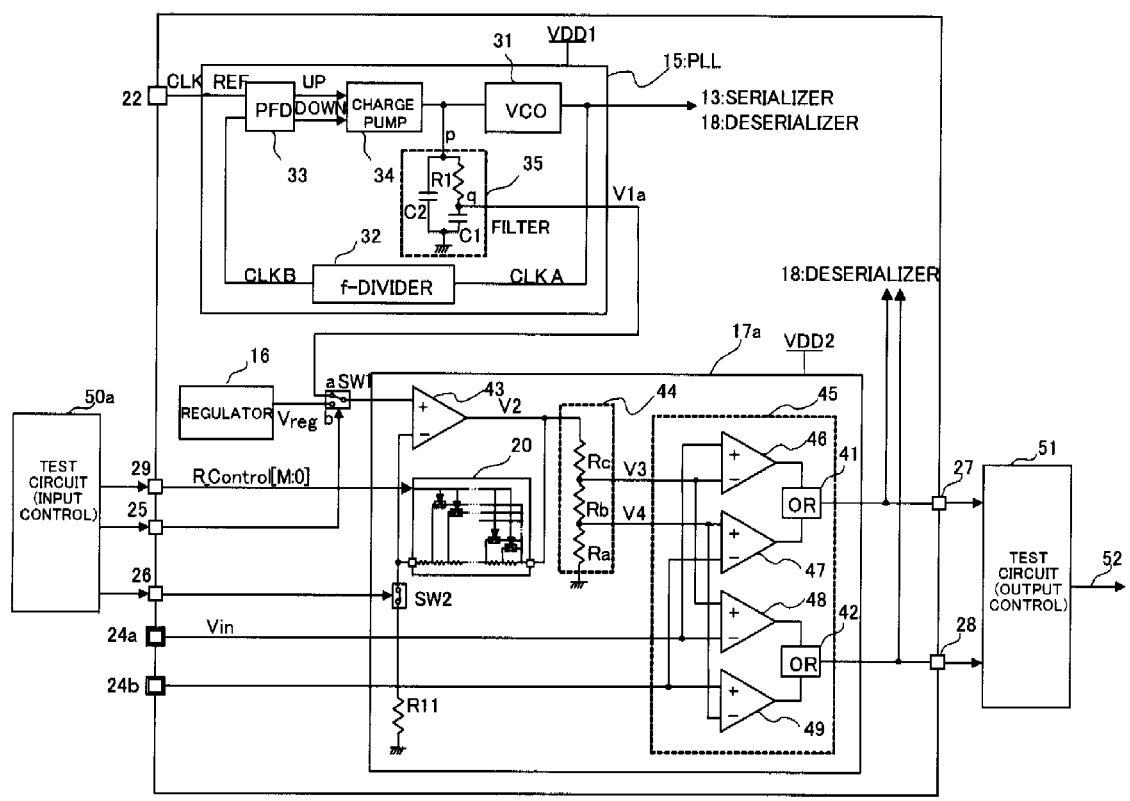
FIG. 15 is a block diagram showing the configuration of a semiconductor device relating to a sixth example of the present invention.
Figure 16:
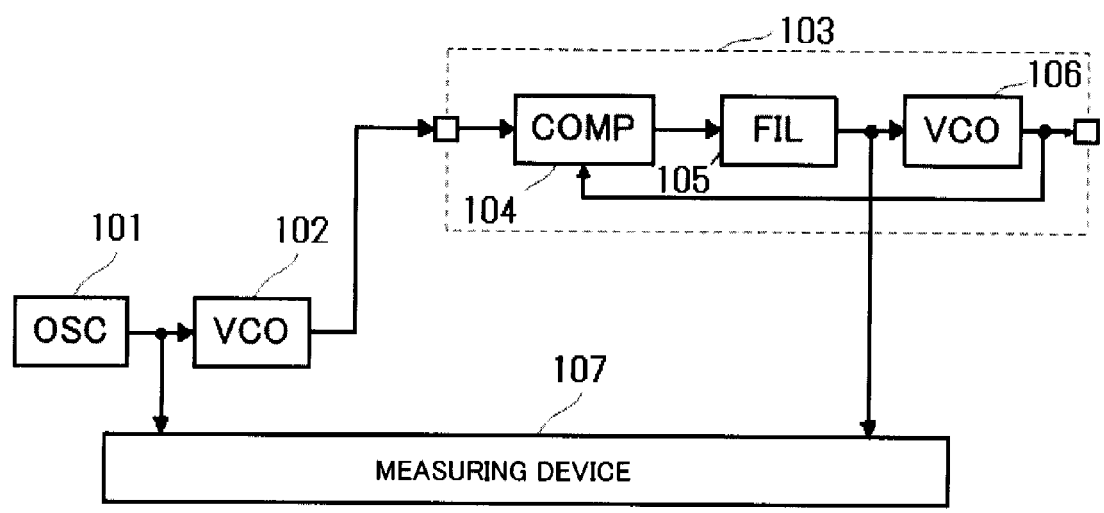
FIG. 16 is a block diagram showing a conventional configuration of a device that measures the transfer characteristics of a phase-locked loop oscillator.

FIG. 15 is a block diagram showing the configuration of a semiconductor device relating to a sixth example of the present invention. In FIG. 15, the symbols same as the ones in FIG. 8 indicate the same things, thus the explanations of them will be omitted. In the semiconductor device shown in FIG. 15, the point where the VCO control voltage is drawn, as shown in FIG. 8 (Example 3), is changed from the contact point (the point p) of the charge pump 34, the VCO 31, and the filter 35 to the point q, the serial connection point of the resistance and the condenser constituting the filter 35. By using such a configuration, the effects of both Examples 3 and 4 can be obtained.

Further, the disclosure of the aforementioned Patent Document is incorporated herein in the present application by reference thereto.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a phase locked loop circuit, referred to as PLL circuit, a buffer amplifier, and an output terminal;
   an input terminal; and
   a comparator between said buffer amplifier and said output terminal;
   wherein a control voltage of a voltage controlled oscillator circuit in said PLL circuit is outputted to said output terminal via said buffer amplifier, and wherein said comparator has one of its input ends connected to an output end of said buffer amplifier, the other input end connected to said input terminal, and its output end connected to said output terminal.

2. The semiconductor device as defined in claim 1 further comprising:
- a voltage generating circuit that generates a voltage, which serves as a judging reference for the signal level of a serial data signal;
- a switch circuit that performs switching operations so that the output of said buffer amplifier is connected to one of the input ends of said comparator in test mode and an output of said voltage generating circuit is connected to the other input end of said comparator in normal mode; wherein said input terminal receives said serial data signal.

3. The semiconductor device as defined in claim 1, further comprising:
- a voltage generating circuit that generates a voltage, which serves as a judging reference for the signal level of a serial data signal; and
- a switch circuit that performs switching operations so that the output of said buffer amplifier is connected to one of the input ends of said comparator in the test mode, and in the normal mode the output of said voltage generating circuit is connected, via said buffer amplifier, to said one of the input ends of said comparator instead of connecting the input of said buffer amplifier to the output of said voltage controlled oscillator circuit; wherein said input terminal receives said serial data signal.

4. The semiconductor device as defined in claim 1 wherein said buffer amplifier is externally gain-adjustable.

5. The semiconductor device as defined in claim 4 wherein the gain of said buffer amplifier is fixed in a normal mode and adjustable in a test mode.

6. The semiconductor device as defined in claim 4 wherein the gain of said buffer amplifier is larger in a test mode than in a normal mode.

7. The semiconductor device as defined in claim 1 wherein an input end of said buffer amplifier is connected to a control input terminal of said voltage controlled oscillator circuit.

8. The semiconductor device as defined in claim 7
wherein said PLL circuit comprises a filter circuit having a second capacitance element connected in parallel to a series circuit of a first capacitance element and a resistance element, between the control input terminal of said voltage controlled oscillator circuit and ground, and the input end of said buffer amplifier is connected to one end of said first capacitance element having the other end grounded, instead of the control input terminal of said voltage controlled oscillator circuit.

* * * * *